(12) United States Patent
Ichihara et al.

(10) Patent No.: US 10,276,797 B2
(45) Date of Patent: Apr. 30, 2019

(54) VAPOR DEPOSITION DEVICE, VAPOR DEPOSITION METHOD, AND METHOD FOR MANUFACTURING ORGANIC ELECTROLUMINESCENCE ELEMENT

(71) Applicant: Sharp Kabushiki Kaisha, Sakai, Osaka (JP)

(72) Inventors: Masahiro Ichihara, Mitsuke (JP); Eiichi Matsumoto, Mitsuke (JP); Yuhki Kobayashi, Sakai (JP); Katsuhiro Kikuchi, Sakai (JP); Shinichi Kawato, Sakai (JP); Takashi Ochi, Sakai (JP); Kazuki Matsunaga, Sakai (JP); Satoshi Inoue, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 189 days.

(21) Appl. No.: 15/527,065

(22) PCT Filed: Nov. 10, 2015

(86) PCT No.: PCT/JP2015/081527
§ 371 (c)(1),
(2) Date: May 16, 2017

(87) PCT Pub. No.: WO2016/080235
PCT Pub. Date: May 26, 2016

(65) Prior Publication Data
US 2019/0097135 A1 Mar. 28, 2019

(30) Foreign Application Priority Data
Nov. 17, 2014 (JP) .................................. 2014-232809

(51) Int. Cl.
*H01L 21/02* (2006.01)
*H01L 51/00* (2006.01)
(Continued)

(52) U.S. Cl.
CPC ........ *H01L 51/0012* (2013.01); *C23C 14/042* (2013.01); *C23C 14/24* (2013.01);
(Continued)

(58) Field of Classification Search
CPC ........... H01L 21/0228; H01L 21/02274; H01L 21/28194; C23C 16/00
See application file for complete search history.

(56) References Cited

U.S. PATENT DOCUMENTS

2011/0189861 A1* 8/2011 Kunow ................. C23C 16/042
438/778

FOREIGN PATENT DOCUMENTS

JP 2013-129898 A 7/2013

* cited by examiner

*Primary Examiner* — Mohammad M Choudhry
(74) *Attorney, Agent, or Firm* — ScienBiziP, P.C.

(57) ABSTRACT

The present invention provides a vapor deposition device including a novel alignment mechanism applicable to a large substrate, a vapor deposition method, and a method for manufacturing an organic electroluminescence element. The vapor deposition device of the present invention is a vapor deposition device for performing vapor deposition while transporting a substrate in a first direction, and includes: a mask; a substrate tray including a substrate-holding portion and a guide portion protruding from the substrate-holding portion to the mask side and disposed along the first direction; at least one distance meter disposed on a first end which is one end of the mask or the guide portion; and at least one driver coupled with a second end which is the other end of the mask. The at least one distance meter is configured to measure a distance between the at least one distance meter and the guide portion or the first end when the guide portion faces the first end. The at least one driver is capable of driving the mask in a second direction perpendicular to the (Continued)

first direction based on the measured value of the at least one distance meter.

13 Claims, 12 Drawing Sheets

(51) Int. Cl.
*C23C 14/24* (2006.01)
*C23C 14/54* (2006.01)
*H01L 51/56* (2006.01)
*C23C 14/50* (2006.01)
*C23C 14/04* (2006.01)

(52) U.S. Cl.
CPC .............. *C23C 14/50* (2013.01); *C23C 14/54* (2013.01); *H01L 51/001* (2013.01); *H01L 51/0011* (2013.01); *H01L 51/56* (2013.01)

VAPOR DEPOSITION DEVICE, VAPOR DEPOSITION METHOD, AND METHOD FOR MANUFACTURING ORGANIC ELECTROLUMINESCENCE ELEMENT

TECHNICAL FIELD

The present invention relates to vapor deposition devices, vapor deposition methods, and methods for manufacturing organic electroluminescence (hereinafter, also abbreviated as EL) elements. The present invention specifically relates to a vapor deposition device, a vapor deposition method, and a method for manufacturing an organic EL element which are suitable for manufacturing an organic EL element on a large substrate.

BACKGROUND ART

Flat panel displays have been widely used in various products and fields in recent years, and the flat panel displays are required to have a larger size, a higher definition, and lower power consumption.

In this situation, organic EL display devices, which include organic EL elements utilizing electroluminescence of organic materials, draw great attention as flat panel displays that are of solid state and are excellent in terms of low-voltage driving, rapid response, and self-luminousness.

The organic EL display devices each include a substrate for an organic EL display device, and the substrate includes, for example, thin film transistors (hereinafter, also abbreviated as TFTs) and organic EL elements connected to the TFTs on an insulating substrate such as a glass substrate. The organic EL elements each have a stacked structure of a first electrode, an organic EL layer, and a second electrode in the given order. The first electrode is connected to the corresponding TFT. The organic EL layer has a stacked structure of layers, such as a hole-injection layer, a hole-transport layer, an electron-blocking layer, a light-emitting layer, a hole-blocking layer, an electron-transport layer, an electron-injection layer.

With regard to organic EL elements, organic materials for forming organic EL layers usually have low water resistance and are not suitable for wet processes. Thus, organic EL layers are generally formed by vacuum vapor deposition utilizing a vacuum thin-film-forming technique. Therefore, a vapor deposition device including a vapor deposition source in a vacuum chamber is widely used in production of an organic EL element including a step of forming an organic layer.

In addition, scanning vapor deposition devices have been developed recently which perform vapor deposition on a substrate through a mask whose area is smaller than that of the substrate while moving the substrate in one direction relative to the vapor deposition source, thereby forming a film-forming pattern.

Specifically, for example, a vapor deposition device is disclosed which performs vapor deposition through multiple opening patterns of a vapor deposition mask while transporting a substrate in the X direction to form a thin-film pattern, wherein the vapor deposition mask includes an alignment mark formed by providing an opening having a certain shape in an edge region on at least one end side in the Y direction crossing the X direction. This vapor deposition device includes an image-sensing means which includes multiple light-receiving elements arranged in a straight line in the Y direction and which is configured to photograph simultaneously both the alignment mark of the vapor deposition mask and a thin-line follow-up mark provided in an edge region of the substrate on at least one end side in the Y direction correspondingly to the alignment mark and parallel to the X direction to allow detection of the positional relationship between the marks; and an alignment means configured to move the substrate and the vapor deposition mask relatively in the XY plane based on the positional relationship between the marks photographed and detected by the image-sensing means, continually during transportation of the substrate, to correct misalignment between the substrate and the vapor deposition mask (for example, see Patent Literature 1).

CITATION LIST

Patent Literature

Patent Literature 1: JP 2013-129898 A

SUMMARY OF INVENTION

Technical Problem

Unfortunately, some of usual scanning vapor deposition devices are inapplicable to large substrates.

FIG. 21 is a schematic cross-sectional view of a vapor deposition device according to Comparative Embodiment 1 that the inventors have examined.

As illustrated in FIG. 21, the vapor deposition device according to Comparative Embodiment 1 includes a chamber 201, an alignment stage 202 disposed at the bottom or upper portion of the chamber 201, multiple drivers 203, a base 204, a mask 207, multiple pillars 205 holding the mask 207, multiple mask holders 206, two or more CCD cameras 208 for alignment, an electrostatic chuck 230 configured to support a glass substrate 210, a limiting plate (not illustrated), and a vapor deposition source (also referred to as a vaporization source, not illustrated), aligning the marks (not illustrated) of the mask 207 relative to the marks (not illustrated) formed at both ends of the glass substrate 210. Thus, the two or more CCD cameras 208 are used to measure the respective distances between the marks. Based on the measured distances, the alignment stage 202 performs 3-axis alignment in the X-axis direction, the Y-axis direction, and the θ direction. Thus, if the substrate 210 used is a large one, and accordingly the vapor deposition source and the mask 207 used are large ones, the pillars 205 holding the mask 207 and the alignment stage 202 also need to be large ones.

This is because the alignment stage 202 includes a plate (not illustrated) having a size in proportion to the dimensions of the substrate 210 or the mask 207 and a 3-axis servo motor attached to the plate and performs alignment using these components.

In order to improve the 3-axis alignment precision, Comparative Embodiment 1 requires marks at separate places on the substrate, e.g., opposite positions on a diagonal, and thus requires the two or more CCD cameras 208 for photographing these marks.

Also, in Comparative Embodiment 1, the vapor deposition source, the limiting plate, and the mask 207 are integrally aligned. Thus, the pillars 205 may elongate due to a weight increase of the alignment stage 202 and a thermal effect from the vapor deposition source, possibly causing a change in distance between the substrate 210 and the mask 207 and generation of thermal drift (slight misalignment during long-term working).

Since the vapor deposition device disclosed in Patent Literature 1 performs alignment using an alignment means disposed at the bottom of the mask, it needs to include a mask-holding mechanism. Thus, the device is affected by heat of the vapor deposition source and adhesion of the material. If the alignment means is driven from the outside of the chamber, it is no different from the alignment mode of Comparative Embodiment 1. In addition, the chamber is deformed by exhaustion. Thus, in some methods of installing the alignment means, the device further needs to include a mechanism for cancelling the deformation of the chamber in order to improve the alignment precision.

The influences due to heat of the vapor deposition source and adhesion of the material are specifically as follows.

That is, in the vapor deposition device disclosed in Patent Literature 1, the alignment means is disposed near the vapor deposition source and a hood is disposed between the vapor deposition source and the alignment means. Thus, the temperature is easily increased due to radiant heat from the vapor deposition source. Further, peeling or re-evaporation of the material attached to the hood may possibly cause blur of the pattern. If an alignment means requiring high-precision driving is disposed between the vapor deposition source and the mask, the driving may be affected by thermal elongation due to radiant heat from the vapor deposition source or adhesion of the material. Nevertheless, Patent Literature 1 fails to disclose a cooling mechanism or a protecting mechanism for preventing adhesion of the material. Thus, Patent Literature seems to be unsuccessful in achieving high-precision alignment. Further, the paragraph [0039] of Patent Literature 1 discloses that the alignment means may be disposed on the substrate holder. Also in this case, the pattern may be thickened, resulting in an influence on the film-forming pattern if there is no means for aligning the mask in the θ direction.

The present invention is devised in the aforementioned situation, and aims to provide a vapor deposition device including a novel alignment mechanism applicable to a large substrate, and a vapor deposition method and a method for manufacturing an organic electroluminescence element which are applicable to a large substrate.

Solution to Problem

One aspect of the present invention may be a vapor deposition device for performing vapor deposition while transporting a substrate in a first direction, the vapor deposition device including:

a mask including a first end, a second end disposed on the side opposite to the first end, and a main surface provided with multiple openings for patterning;

a substrate tray including a substrate-holding portion configured to hold a substrate and a guide portion protruding from the substrate-holding portion in the direction crossing a plane parallel to the substrate and disposed along the first direction;

a transport guide configured to guide the substrate tray in the first direction such that the substrate-holding portion and the guide portion respectively face the main surface and the first end:

at least one distance meter disposed on the first end or the guide portion; and at least one driver coupled with the second end, the at least one distance meter being configured to measure a distance between the at least one distance meter and the guide portion or the first end when the guide portion faces the first end, the at least one driver being capable of driving the mask in a second direction perpendicular to the first direction based on the measured value of the at least one distance meter.

Hereinafter, this vapor deposition device is also referred to as the vapor deposition device according to the present invention.

The following will describe preferred embodiments of the vapor deposition device according to the present invention. The following preferred embodiments may be appropriately combined. An embodiment achieved by combining any two or more of the following preferred embodiments is also one preferred embodiment.

The at least one distance meter may include an optical distance meter.

The at least one distance meter may include a contact distance meter and may be disposed on the guide portion.

The contact distance meter may include an elastic distance measurement portion and a roller supported by the distance measurement portion in a rotatable manner.

The at least one distance meter may include multiple distance meters and the at least one driver may include two drivers, and the two drivers may be coupled with the second end at different places in the first direction.

Each of the distance meters may be a contact distance meter including an elastic distance measurement portion and a roller supported by the distance measurement portion in a rotatable manner, the distance meters may be disposed over the entire guide portion along the first direction such that the distance measurement portions are elastic in the second direction and the rollers are rotatable in the first direction, the first end may include a roller-contact portion configured to be in contact with the rollers when the guide portion faces the first end, the roller-contact portion may include a flat middle portion in the first direction, at least two of the rollers may be configured to be in contact with the middle portion when the guide portion faces the first end, and at least two of the distance measurement portions supporting the at least two rollers in contact with the middle portion may each be configured to shrink to measure a distance between the distance meter and the first end.

Each of the distance meters may be a contact distance meter including an elastic distance measurement portion and a roller supported by the distance measurement portion in a rotatable manner, the distance meters may be disposed on the guide portion, the first end may include a roller-contact portion configured to be in contact with the rollers when the guide portion faces the first end, and the roller-contact portion may be partially inclined toward the second end on the upstream and downstream sides of transportation of the substrate.

The at least one driver may be removably coupled with the second end.

The vapor deposition device may further include a vapor deposition source and a limiting plate disposed between the vapor deposition source and the mask, wherein the vapor deposition device may be free from a binding component integrating the mask with the limiting plate and the vapor deposition source between the limiting plate and the mask.

The vapor deposition device may further include an imager, wherein the main surface may include an alignment mark, and the imager may be configured to photograph simultaneously the alignment mark and an alignment mark on the substrate held by the substrate-holding portion.

The vapor deposition device may include first and second masks each serving as the mask, first and second distance meters each serving as the distance meter, and first and second drivers each serving as the driver, the guide portion may be disposed across a center portion of the substrate-holding portion, and the first and second masks, the first and second distance meters, and the first and second drivers may be disposed symmetrically about the guide portion.

Another aspect of the present invention may be a vapor deposition method including a vapor deposition step of forming a film on a substrate, the vapor deposition step being performed using the vapor deposition device according to the present invention.

Still another aspect of the present invention may be a method for manufacturing an organic electroluminescence element, including a vapor deposition step of forming a film using the vapor deposition device according to the present invention.

Advantageous Effects of Invention

The present invention can achieve a vapor deposition device including a novel alignment mechanism applicable to a large substrate, and a vapor deposition method and a method for manufacturing an organic electroluminescence element which are applicable to a large substrate.

DESCRIPTION OF EMBODIMENTS

Figure 1:
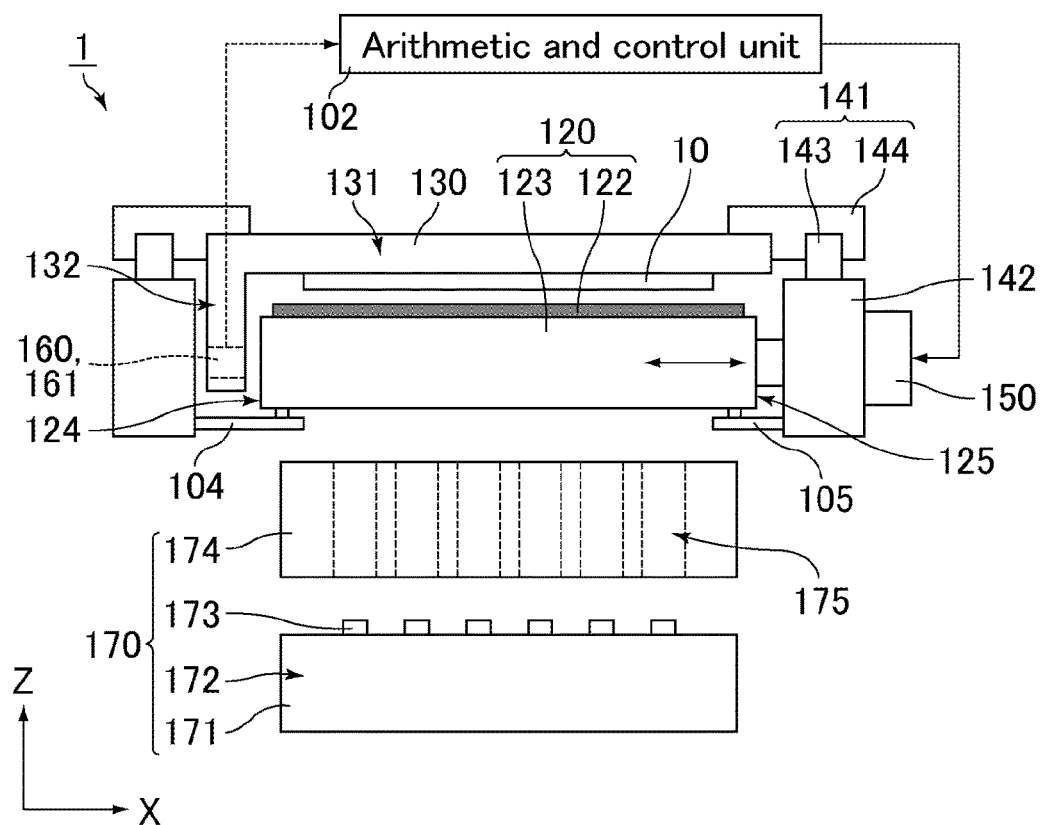
FIG. 1 is a schematic front view of a vapor deposition device according to Embodiment 1.

The present invention will be mentioned in more detail referring to the drawings in the following embodiments, but is not limited to these embodiments.

Embodiment 1

Figure 2:
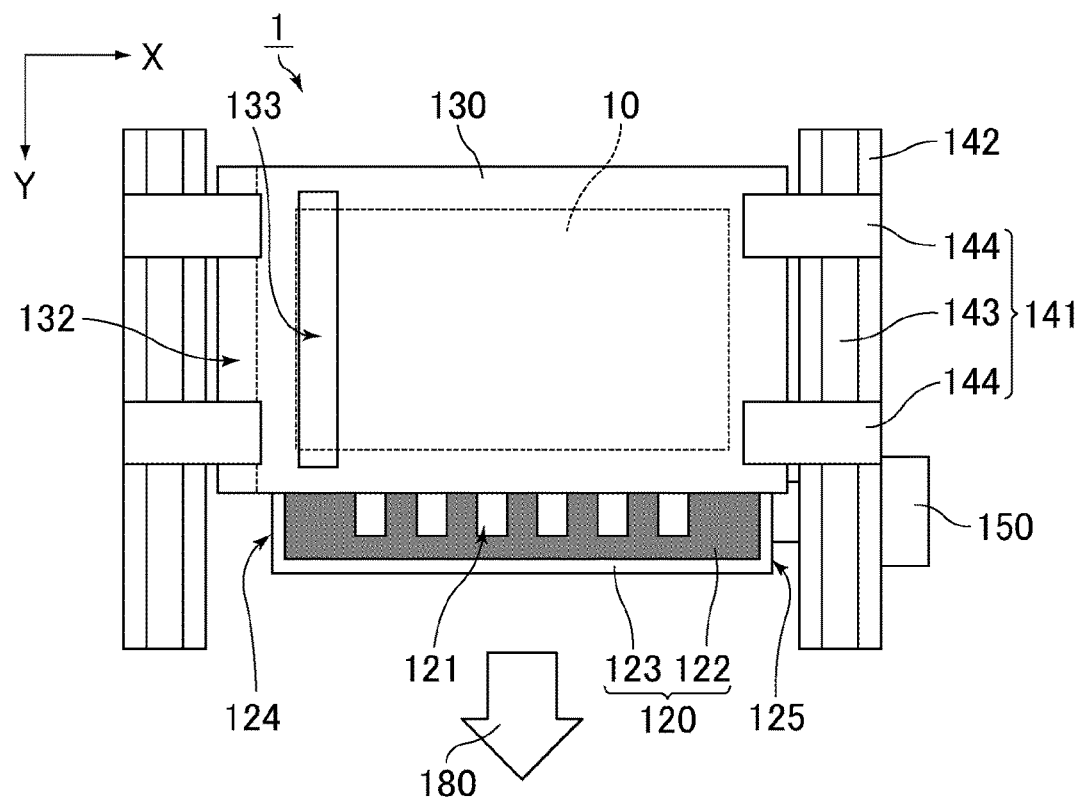
FIG. 2 is a schematic plan view of the vapor deposition device according to Embodiment 1.

FIG. 1 is a schematic front view of a vapor deposition device according to Embodiment 1. FIG. 2 is a schematic plan view of the vapor deposition device according to Embodiment 1.

As illustrated in FIGS. 1 and 2, a vapor deposition device 1 according to the present embodiment includes a mask 120, mask holders 104 and 105 holding the mask 120, a substrate tray 130, transport guides 141, transport stages 142, a tray driver (not illustrated), two drivers 150, multiple optical distance meters 161 serving as multiple distance meters 160, an arithmetic and control unit 102, a vapor deposition unit 170 including a vapor deposition source (vaporization source) 171 and a limiting plate 174, a chamber (vapor deposition chamber, not illustrated), and a vacuum pump (not illustrated). The vapor deposition device 1 uses a novel one-side alignment mode applicable to a large substrate, and performs vapor deposition while transporting a substrate 10 in a first direction 180 (hereinafter, also referred to as the transport direction 180 or the Y-axis direction). The transport direction 180 is perpendicular to the normal direction (hereinafter, also referred to as the Z-axis direction) of the substrate 10. Hereinafter, the direction perpendicular to the first direction (the transport direction 180, Y-axis direction) is also called the second direction or the X-axis direction, and the normal direction of the substrate 10 is also called the Z-axis direction. The X-axis direction, the Y-axis direction, and the Z-axis direction are perpendicular to each other.

The following describes the respective components of the vapor deposition device 1.

A chamber is a container that defines the space for vacuum vapor deposition. Inside the chamber are disposed the mask 120, the mask holders 104 and 105, the substrate tray 130, the transport guides 141, the transport stages 142, at least part of the tray driver, the distance meters 160, the two drivers 150, and the vapor deposition unit 170 including the vapor deposition source 171 and the limiting plate 174. The chamber is coupled with a vacuum pump, and this vacuum pump discharges the air (reduces the pressure) inside the chamber during vapor deposition. Thus, the inside of the chamber is maintained at low pressure.

The mask 120 is a hollow cuboidal component without a bottom, and includes a main surface 122 which is a thin plate-like component with multiple openings 121 for patterning and a rectangular frame 123 with an opening corresponding to the openings 121. The frame 123 is a reinforcing component for suppressing deflection of the main surface 122, and the main surface 122 is welded to the frame 123 in a tensioned state. The frame 123 of the mask 120 includes a first end 124 disposed along the transport direction 180 and a second end 125 disposed on the side opposite to the first end 124. When viewed along the Z axis, the main surface 122 is positioned between the ends 124 and 125. The mask 120 is disposed apart from the substrate 10, and a certain gap is formed between the substrate 10 and the mask 120 during transportation of the substrate 10.

The mask holders 104 and 105 respectively support the first and second ends 124 and 125. The mask holders 104 and 105 support the mask 120 so as to enable (so as not to hinder) alignment of the mask 120 by the drivers 150 based on the measurement data from the distance meters 160. More specifically, the mask holders 104 and 105 support the mask 120 such that the mask 120 is movable in the X-axis direction and rotatable in the θ direction. It should be noted that the amounts of movement of the mask 120 in the X-axis direction and in the θ direction are usually very small.

The phrase "the mask 120 rotates in the θ direction" herein means that the mask 120 rotates in the plane (XY plane) parallel to the X-axis direction and the Y-axis direction.

The following describes one example of a mechanism holding the mask 120 such that the mask 120 is (slightly) movable in the X-axis direction and (slightly) rotatable in the θ direction.

Figure 3:
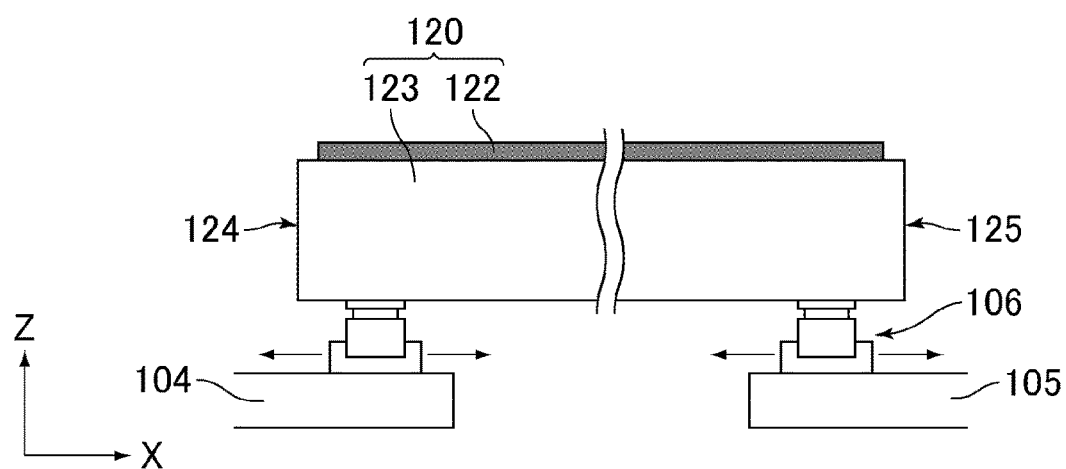
FIG. 3 is a schematic front view of the vapor deposition device according to Embodiment 1, mainly illustrating a mask and mask holders.

FIG. 3 is a schematic front view of the vapor deposition device according to Embodiment 1, mainly illustrating a mask and mask holders.

As illustrated in FIG. 3, each of the mask holders 104 and 105 is provided with a guide 106 movable in the X-axis and Y-axis directions on the mask 120 side. The guide 106 may be a vertical combination of two identical linear guides, for example. In this case, the guides 106 are movable in the X-axis and Y-axis directions, and are rotatable in the θ direction owing to the combination of these two shafts (linear guides).

Each guide 106 is fixed not to the mask 120 but to the mask holder 104 or 105, and the mask 120 is removable from the mask holders 104 and 105 and the guides 106. Thus, the mask 120 can be easily replaced.

The mechanism holding the mask 120 such that the mask 120 is (slightly) movable in the X-axis direction and (slightly) rotatable in the θ direction may be any mechanism, and may be a spherical roller bearing. This allows the mask holders 104 and 105 to support the mask 120 such that the mask 120 is movable in the X-axis and Y-axis directions and rotatable in the θ direction.

The substrate tray 130 is a component configured to hold the substrate 10, preferably an organic EL element substrate, to be subjected to vapor deposition (film formation), and is disposed at the upper portion of the chamber. The substrate tray 130 is configured to hold the substrate 10 such that the vapor-deposition-target surface thereof faces the mask 120. As illustrated in FIG. 1, the substrate tray 130 has an L-like shape when viewed from the front side, i.e., along the transport direction 180. The substrate tray 130 includes a substrate-holding portion 131 facing the main surface 122 of the mask 120 and configured to hold the substrate 10 and a guide portion 132 facing the first end 124 of the mask 120. The substrate-holding portion 131 is provided with an adsorbing component (not illustrated) such as an electrostatic chuck or a suction pad, and has a linear opening 133 formed along the transport direction 180. The guide portion 132 is disposed along the transport direction 180, and protrudes from an end of the substrate-holding portion 131 in the direction (e.g., the Z-axis direction) crossing the plane parallel to the substrate 10, i.e., the XY plane.

The substrate-holding portion 131 and the guide portion 132 each have a dimension greater than the substrate 10 in the transport direction 180. In contrast, the mask 120 has a dimension smaller than the substrate 10, the substrate-holding portion 131, and the guide portion 132 in the transport direction 180.

The transport stages 142 are each coupled with and fixed to the chamber, have a structure that is less likely to be affected by deformation and other defects of the chamber, and hold the corresponding transport guide 141.

The transport guides 141 are each coupled with and fixed to the substrate tray 130, and the transport guides 141 guide the substrate tray 130 in the transport direction 180 (Y-axis direction) such that the substrate-holding portion 131 and the guide portion 132 respectively face the main surface 122 and the first end 124. The transport guides 141 each may have any specific mechanism. For example, as illustrated in FIGS. 1 and 2, the mechanism may include a guide rail 143 extending in the Y-axis direction and sliders 144 slidable along the guide rail 143. The substrate tray 130 may be coupled with and fixed to the sliders 144.

The substrate tray 130 is also coupled with a tray driver that can drive the substrate tray 130 in the Y-axis direction. The tray driver moves the substrate 10 held by the substrate tray 130 at a constant speed along the transport direction 180, allowing the substrate 10 to pass near the main surface 122. The tray driver may have any specific mechanism. For example, the mechanism may include a ball screw extending in the Y-axis direction, a driving motor (electric motor), such as a servo motor or a stepping motor, driving the ball screw in a rotational manner, and a motor drive controller electrically coupled with the driving motor.

Figure 4:
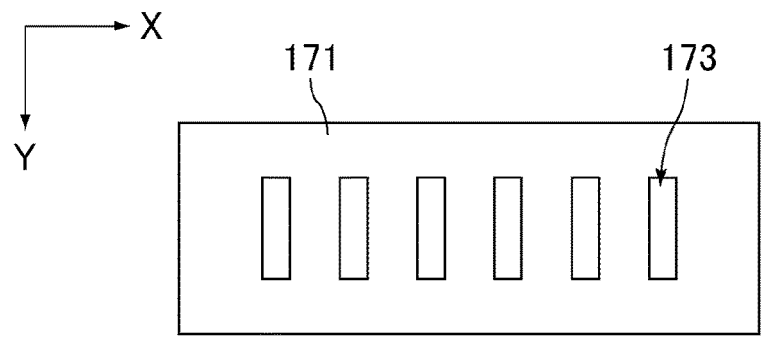
FIG. 4 is a schematic plan view of the vapor deposition device according to Embodiment 1, illustrating a vapor deposition source.

FIG. 4 is a schematic plan view of the vapor deposition device according to Embodiment 1, illustrating a vapor deposition source.

The vapor deposition source 171 is a component configured to gasify, i.e., evaporate or sublimate, by heating, a material (preferably an organic material) to be vapor-deposited in vacuo to emit the gasified material into the chamber, and is disposed at the lower portion of the chamber. More specifically, the vapor deposition source 171 includes a heat-resistant container (not illustrated), such as a crucible, for containing the material, a heating device (not illustrated) for heating the material contained in the container, such as a heater and a heating power supply, and a diffusing portion 172 that defines the space for diffusing the material gasified. As illustrated in FIGS. 1 and 4, multiple injection ports (openings) 173 are disposed at an upper portion of the diffusing portion 172. The vapor deposition source 171 heats and gasifies the material in the container with the heating device, and then emits gasified portions of the material (hereinafter, also referred to as vapor deposition particles) upward through the injection ports 173. As a result, the injection ports 173 generate vapor deposition streams which are streams of the vapor deposition particles, and the vapor deposition streams isotropically spread from the injection ports 173.

The vapor deposition source 171 may be of any type, and may be a point vapor deposition source (point source), a line vapor deposition source (line source), or a plane vapor deposition source. The vapor deposition source 171 may use any heating method, such as resistive heating, electron beam heating, laser vapor deposition, high frequency induction heating, or arc heating.

Figure 5:
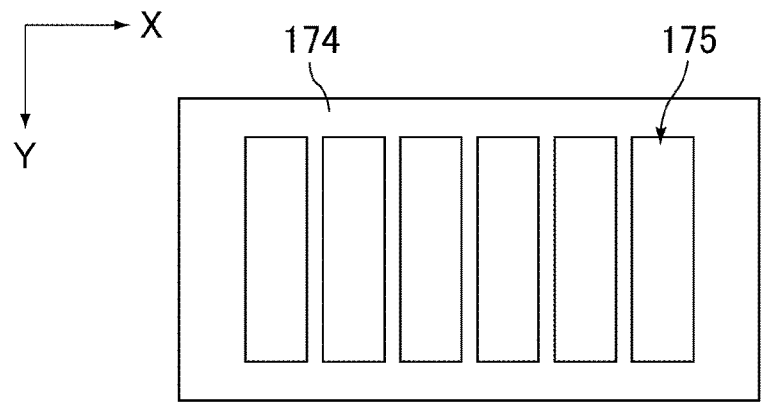
FIG. 5 is a schematic plan view of the vapor deposition device according to Embodiment 1, illustrating a limiting plate.

FIG. 5 is a schematic plan view of the vapor deposition device according to Embodiment 1, illustrating a limiting plate.

As illustrated in FIGS. 1 and 5, the limiting plate 174 is a plate-like component provided with multiple openings 175 correspondingly to the injection ports 173 of the vapor deposition source 171, and eliminates unnecessary components among the vapor deposition particles emitted from the injection ports 173. The limiting plate 174 is disposed between the vapor deposition source 171 and the mask 120, and vapor deposition streams rise from the injection ports 173 to the corresponding openings 175 of the limiting plate 174. Some of the vapor deposition particles contained in the vapor deposition streams can pass through the openings 175 of the limiting plate 174 to reach the mask 120. The rest of the vapor deposition particles adhere to the limiting plate 174 and fail to pass through the openings 175 of the limiting plate 174, and thus fail to reach the mask 120. Thereby, the vapor deposition streams that isotropically spread immediately after spouting from the injection ports 173 are controlled by the limiting plate 174, and highly directed components are generated while poorly directed components are blocked. Further, the limiting plate 174 prevents passing of the respective vapor deposition streams through the openings 175 other than the opening 175 that is right above the stream. The limiting plate 174 may be formed from a metal material, for example.

As mentioned above, the mask 120 is provided with the openings 121 for pattern formation. Thus, some of the vapor deposition particles reaching the mask 120 can pass through the openings 121. Thereby, the vapor deposition particles are deposited on the substrate 10 in a pattern corresponding to the openings 121.

The vapor deposition unit 170 including the vapor deposition source 171 and the limiting plate 174 is fixed to the chamber and is fixed relative to the transport axis of the substrate 10 and the driving axis of the mask 120. The vapor deposition device 1 is free from a binding component (e.g., a pillar) integrating the mask 120 with the limiting plate 174 and the vapor deposition source 171 between the limiting plate 174 and the mask 120. The vapor deposition source 171 and the limiting plate 174 are not in contact with the mask 120.

The distance meters 160 are disposed on the guide portion 132. Each distance meter 160 can measure the distance between the distance meter itself and the first end 124 when it faces the first end 124. Each optical distance meter 161 can measure the distance between the distance meter itself and the first end 124 without a contact with the first end 124 when it faces the first end 124. Specific examples of the optical distance meter 161 include, but are not limited to, laser distance meters irradiating a target with laser and then receiving the reflected light to determine the distance on the principle of triangulation, and optical distance meters using optical fibers.

Figure 6:
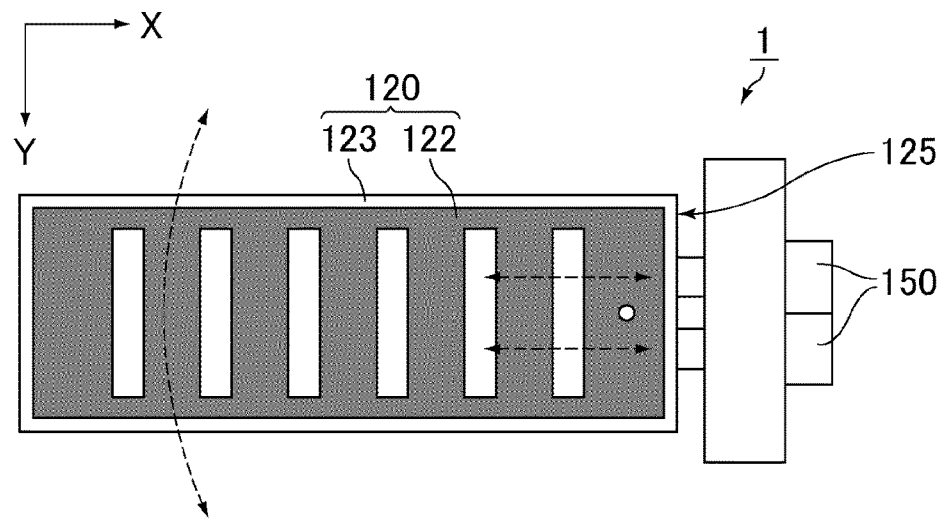
FIG. 6 is a schematic plan view of the vapor deposition device according to Embodiment 1, mainly illustrating the mask and drivers.

FIG. 6 is a schematic plan view of the vapor deposition device according to Embodiment 1, mainly illustrating the mask and drivers.

Each driver 150 is fixed to the transport stage 142 and is removably coupled with the second end 125 of the mask 120. Based on the input amount of movement from the arithmetic and control unit 102, each driver can drive the mask 120 in the X-axis direction. As illustrated in FIG. 6, the two drivers 150 are coupled with the same second end 125. Still, they are coupled with the second end 125 at different places in the Y-axis direction, and can independently drive the mask 120. Thus, the drivers can not only drive the mask 120 in the X-axis direction but also rotate it in the θ direction.

In contrast, the vapor deposition unit 170, which is not in contact with the mask 120 and includes the vapor deposition source 171 and the limiting plate 174, does not move but remain fixed to the chamber even when the mask 120 is moved.

Each driver 150 may have any specific mechanism, such as a mechanism including a driving motor (electric motor) (e.g., a servo motor), a gear, and a linear guide extending in the X-axis direction.

A specific mechanism for removably coupling the drivers 150 to the second end 125 may be any mechanism, such as a clamp mechanism. In this case, the clamp is driven such that the clamp catches the second end 125 so as to allow the drivers 150 to be coupled and integrated with the second end 125, while the clamp is released so as to allow the drivers 150 to be removed from the second end 125.

The drivers 150 may be fixed to the frame 123 of the mask 120, and may be removably coupled with the transport stage 142.

Next, the following describes the motion of the vapor deposition device 1, in other words, the vapor deposition step using the vapor deposition device 1.

First, the inside of the chamber is decompressed to be a low pressure state using a vacuum pump. Also, a material contained in the vapor deposition source 171 is heated to generate vapor deposition streams. Next, the substrate 10 is carried into the chamber through an inlet (not illustrated) by a transport robot (not illustrated) such as a robot arm. Then, the position of the substrate 10 relative to the substrate-holding portion 131 is adjusted by a substrate-positioning mechanism, and the substrate 10 is held by the substrate-holding portion 131 (the substrate 10 is pre-aligned). Also, the arithmetic and control unit 102 supplies a predetermined value to the drivers 150 and the drivers 150 drive the mask 120, so that the mask 120 is placed at a predetermined position (the mask 120 is pre-aligned).

Then, the transport guides 141 and the tray driver transport (move and scan) the substrate 10 together with the substrate tray 130 in the transport direction 180, so that the substrate tray 130 and the substrate 10 are allowed to pass near the mask 120. At this time, the substrate tray 130 is transported such that the substrate-holding portion 131 and the guide portion 132 respectively face the first end 124 and the main surface 122. Thus, the substrate-holding portion 131 and the substrate 10 pass near above the mask 120 (main surface 122) and the guide portion 132 passes near the side of the mask 120 (first end 124). Then, the vapor deposition particles passing through the openings 121 of the mask 120 successively attach to the substrate 10 moving relative to the vapor deposition unit 170, thereby drawing a film-forming pattern, preferably a pattern of a light-emitting layer of an organic EL element, correspondingly to the openings 121. The distance (gap) between the substrate 10 and the main surface 122 and the distance (gap) between the first end 124 and the guide portion 132 may be any appropriately set values.

In the present embodiment, vapor deposition is performed while the substrate 10 is transported in the Y-axis direction, so that the mask 120 needs not to be aligned in the Y-axis direction. Thus, the mask 120 is aligned in the X-axis direction and the θ direction. Since the substrate 10 and the mask 120 are pre-aligned, the position of the mask 120 relative to the substrate 10 in the X-axis direction and the orientation of the mask 120 relative to the substrate 10 are substantially aligned to the target position and orientation. Still, the alignment of the mask 120 in the X-axis direction particularly requires high precision.

Each distance meter 160 measures the distance between the distance meter 160 (itself) and the first end 124 when the guide portion 132 faces the first end 124.

Then, each driver 150 can drive the mask 120 in the X-axis direction based on the measurement data (measured values) of the distance meters 160.

Thereby, the position and orientation of the mask 120 can be controlled while the substrate 10 is transported in the Y-axis direction such that the distance between the first end 124 and the guide portion 132 is a predetermined distance and the first end 124 is oriented in the extending direction of the guide portion 132.

Therefore, the position of the mask 120 relative to the substrate 10 in the X-axis direction and the inclination of the mask 120 in the θ direction can be corrected while the substrate 10 is transported.

More specifically, the distance meters 160 successively, from the downstream one to the upstream one, measure the distances to the first end 124 when the guide portion 132 passes near the side of the first end 124. The measurement data from the distance meters 160 are supplied to the arithmetic and control unit 102 via cables disposed in the chamber and moved together with the substrate tray 130.

The arithmetic and control unit 102 compares the input measurement data from the distance meters 160 with a predetermined target distance (target value) and, based on the difference therebetween, calculates a required amount of movement of the mask 120 in the X-axis direction and the θ direction so as to match the distance between the first end 124 and the guide portion 132 with the target distance. The target value is set such that the distance between the first end 124 and the guide portion 132 matches with the predetermined distance (target distance).

Next, the arithmetic and control unit 102 calculates required amounts of movement of the drivers 150 based on the required amount of movement of the mask 120, and finally supplies these amounts of movement to the respective drivers 150 via cables. Then, each driver 150 drives the mask 120 in the X-axis direction by the input required amount of movement.

When the two drivers 150 are driven in a similar manner, the mask 120 is driven only in the X-axis direction, not driven in the θ direction. When the two drivers 150 are driven in different manners, the mask 120 is driven in both the X-axis direction and the θ direction, or driven only in the θ direction, not driven in the X-axis direction.

As a result, the distance between the first end 124 and the guide portion 132 matches with the predetermined distance and the gap between the first end 124 and the guide portion 132 becomes substantially constant along the transport direction 180. Thereby, the mask 120 is aligned in the X-axis direction and the θ direction.

The above control may be performed only once while the substrate tray 130 passes near the mask 120. Still, the control is preferably performed repeatedly (successively).

In the present embodiment, alignment of the mask 120 relative to the substrate 10 is not directly performed based on the positional relationship between the mask 120 and the substrate 10, but indirectly performed based on the measurement data of the distance meters 160, in other words, the positional relationship between the substrate tray 130 provided with the distance meters 160 and the mask 120 which is the target of the distance measurement. Still, the substrate 10 is pre-aligned relative to the substrate-holding portion 131 as mentioned above, and the precision of this pre-alignment is allowable in practice. Thus, even though the mask 120 is indirectly aligned relative to the substrate 10, the precision thereof is allowable in practice.

An embodiment enabling alignment of the mask 120 in the X-axis direction and the θ direction with higher precision will be described in Embodiment 3.

Even if the vapor deposition source 171 and the limiting plate 174 are fixed and the mask 120 alone is driven, it hardly affects a blur of the film-forming pattern.

Figure 7:
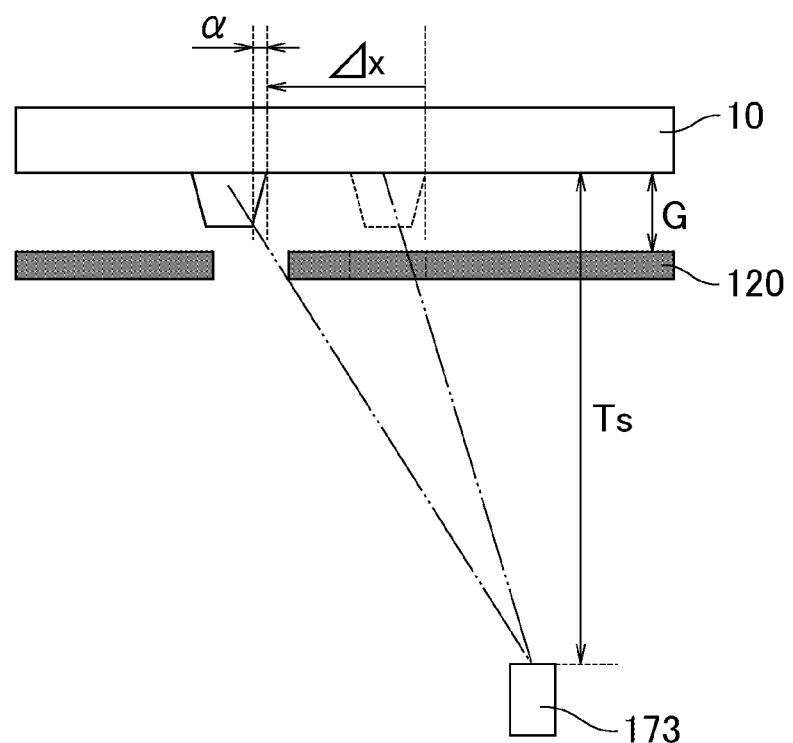
FIG. 7 is a schematic cross-sectional view of the vapor deposition device according to Embodiment 1, mainly illustrating the mask and a substrate.

FIG. 7 is a schematic cross-sectional view of the vapor deposition device according to Embodiment 1, mainly illustrating the mask and a substrate.

As illustrated in FIG. 7, for example, an increment $\Delta\alpha$ of the width a of a blur of the film-forming pattern can be calculated by the following formula:

$$\Delta\alpha = (\Delta x + \Delta\alpha) \times G/Ts$$

$$\Delta\alpha = (\Delta x \times G/Ts)/(1 - G/Ts)$$

$$\approx \Delta x \times G/Ts$$

wherein Ts represents the distance between one injection port 173 of the vapor deposition source 171 and the substrate 10, and is 200 mm; G represents the gap between the mask 120 and the substrate 10, and is 1 mm; and $\Delta x$ represents the shift of the mask 120 in the X-axis direction, and is 0.1 mm. This calculation results in $\Delta\alpha \approx 0.0005$ mm, and thus the width of the blur hardly increases.

This embodiment describes the case where the distance meters 160 are disposed on the guide portion 132. Alternatively, the distance meters 160 may be disposed not on the guide portion 132 but on the first end 124 of the mask 120. Each of these distance meters 160 may measure the distance between the distance meter 160 (itself) and the guide portion 132 when the guide portion 132 faces the first end 124. It should be noted that the frame 123 requires precise parameters such as strength and parallelism in order to give tension to the main surface 122, and thus attachment of other components to the frame 123 should be avoided to the utmost. Thus, in order to improve the precision of the frame 123, the distance meters 160 are preferably disposed on the guide portion 132 rather than on the first end 124.

The following describes the characteristic configurations of the present embodiment and the effects thereof.

The vapor deposition device 1 according to the present embodiment is a vapor deposition device for performing vapor deposition while transporting the substrate 10 in the transport direction 180 (first direction). The vapor deposition device 1 includes: the mask 120 including the first end 124, the second end 125 disposed on the side opposite to the first end 124, and the main surface 122 provided with the openings 121 for patterning; the substrate tray 130 including the substrate-holding portion 131 configured to hold the substrate 10 and the guide portion 132 protruding from the substrate-holding portion 131 in the direction crossing the XY plane (a plane parallel to the substrate 10) and disposed along the transport direction 180; the transport guide configured to guide the substrate tray 130 in the transport direction 180 such that the substrate-holding portion 131 and the guide portion 132 respectively face the main surface 122 and the first end 124; the distance meters 160 disposed on the first end 124 or the guide portion 132; and the two drivers 150 coupled with the second end 125 at different places in the transport direction 180. Each of the distance meters 160 is configured to measure a distance between the distance meter 160 itself and the guide portion 132 or the first end 124 when the guide portion 132 faces the first end 124. Each of the drivers 150 is capable of driving the mask 120 in the X-axis direction (second direction perpendicular to the first direction) based on the measured values of the distance meters 160.

As mentioned above, the vapor deposition device 1 includes the distance meters 160 disposed on the first end 124 or the guide portion 132 and the two drivers 150 disposed on the second end 125 at different places in the transport direction 180, each of the distance meters 160 is configured to measure a distance between the distance meter 160 itself and the guide portion 132 or the first end 124 when the guide portion 132 faces the first end 124, and each of the drivers 150 is capable of driving the mask 120 in the X-axis direction (the second direction perpendicular to the first direction) based on the measured values of the distance meters 160. Thus, the vapor deposition device 1 can control the mask 120 while transporting the substrate 10 such that the distance between the first end 124 and the guide portion 132 is a predetermined distance and the first end 124 is oriented in a predetermined direction relative to the guide portion 132. Therefore, the vapor deposition device 1 can correct the position of the mask 120 relative to the substrate 10 in the X-axis direction and the inclination of the mask 120 in the θ direction while transporting the substrate 10.

The distance meters 160 each may be a device such as the optical distance meter 161 or a contact distance meter to be mentioned later. In either case, the distance meters 160 do not hinder transportation of the substrate tray 130 and the substrate 10.

Unlike the vapor deposition device according to Comparative Embodiment 1, the vapor deposition device 1 according to the present embodiment can align the mask 120 in the X-axis direction and the θ direction without disposing an alignment stage at an upper or lower portion of the chamber, achieving a novel alignment mechanism which has never been achieved. Even if the substrate 10 is a large one, the mask 120 can be aligned only by lengthening the guide portion 132 and increasing the number of the distance meters 160 in the case where the distance meters 160 are disposed on the guide portion 132. In the case where the distance meters 160 are disposed on the first end 124, the mask 120 can be aligned only by lengthening the guide portion 132. Further, in the vapor deposition device according to Comparative Embodiment 1, the alignment stage needs to support the whole mask while the mask is driven. Thus, a stronger driver is required as the mask becomes bigger. In the present embodiment, the mask 120 also needs to be a large one if the substrate 10 is a large one and thus has a great width in the X-axis direction. Still, in the present embodiment, the mask 120 can be held by different components such as the mask holders 104 and 105. Thus, the present embodiment can suppress an increase in the burden on the drivers 150 due to an increase in the size of the mask 120. Therefore, the present embodiment can achieve a vapor deposition device provided with a novel alignment mechanism applicable to the substrate 10 which is a large one.

In the vapor deposition device according to Comparative Embodiment 1, the alignment stage and the drivers need to be large ones if the substrate and the mask are large ones. In contrast, the present embodiment does not require such a large alignment stage and such large drivers, resulting in cost reduction.

The distance meters 160 can be disposed on one of the first end 124 and the guide portion 132 and the drivers 150 can be coupled with a component other than the chamber, such as the transport stage 142. In this case, these devices can be kept away from the influence of deformation of the chamber. Thus, the present embodiment enables more precise alignment than in the case of coupling the alignment mechanism with the chamber.

Further, the vapor deposition device 1 of the present embodiment can successively transport multiple substrate trays 130 and successively perform vapor deposition on (mass-produce) multiple substrates 10. In this case, however, there may be errors in precision, such as machining precision and installation precision, among the substrate trays 130. Still, in the present embodiment, each distance meter 160 is disposed on either the first end 124 or the guide portion 132 and measures the distance between the distance meter 160 itself and the first end 124 or the guide portion 132. Then, based on the measurement data, each driver 150 drives the mask 120 in the X-axis direction. Therefore, the present embodiment enables alignment in accordance with the precision errors of the substrate trays 130, and thus can improve the alignment precision of the mask 120 relative to the substrates 10.

Since the transport stage 142 is provided with the transport guide 141 configured to guide the motion of the substrate tray 130 and components of the tray drivers such as driving motors and rollers, it may generate greater vibration than the substrate tray 130. However, since the distance meters 160 are disposed not on the transport stage 142 but on either the first end 124 or the guide portion 132, the present embodiment can reduce misalignment due to transmission of the vibration of the transport stage 142 to the mask 120.

In the case of using a common aligning means, alignment needs to be repeated multiple times so as to move the alignment mark of the substrate and the alignment mark of the mask to the respective predetermined positions if they are greatly apart from each other. Thus, the alignment takes a lot of time, affecting the takt time during mass production. In contrast, the present embodiment can align the mask 120 in the X-axis direction and the θ direction while transporting the substrate 10, as mentioned above. Thus, the present embodiment can achieve both reduction in alignment time and improvement in alignment precision.

The vapor deposition device according to Comparative Embodiment 1 always needs to stop the substrate during alignment of the mask, and requires time to open and close a shutter and time to stabilize the rate. In contrast, the vapor deposition device 1 according to the present embodiment does not require such processes, achieving a high takt time. More specifically, the vapor deposition device according to Comparative Embodiment 1 needs to align the alignment marks at the centers of the substrate and the mask. At this time, in order to prevent adhesion of the material to the substrate, the device needs to close the shutter, move the substrate to a predetermined position and perform alignment, temporarily evacuate the substrate from above the mask, open the shutter, and then allow the substrate to pass above the mask again to form a film. In contrast, the vapor deposition device 1 of the present embodiment can transport the substrate 10 while aligning the mask 120 in the X-axis direction by the drivers 150 based on the measurement data from the distance meters 160 within a margin of error of 5 µm or smaller. Thus, the present embodiment does not need to stop the substrate 10 and can eliminate the time to open and close the shutter and to stabilize the rate.

The vapor deposition device according to Comparative Embodiment 1 requires two or more CCD cameras. In contrast, the present embodiment includes the distance meters 160 disposed on the first end 124 or the guide portion 132. This enables alignment of the mask 120 based on the measurement data at one measurement site alone, further simplifying the alignment system.

The paragraph [0038] of Patent Literature 1 discloses an embodiment in which alignment is performed by photographing the alignment mark and the follow-up mark with a single imager. In this case, the alignment needs to be performed within the range of the field of vision of the single imager. Thus, if a large substrate is used, alignment with high precision requires a lot of time. In contrast, since the present embodiment performs alignment using a combination of the distance meters 160 and the drivers 150, it enables rapid alignment and successive alignment of multiple substrates 10 held by multiple substrate trays 130.

The vapor deposition device 1 includes the vapor deposition source 171 and the limiting plate 174 disposed between the vapor deposition source 171 and the mask 120, but is free from a binding component integrating the mask 120 with the limiting plate 174 and the vapor deposition source 171 between the limiting plate 174 and the mask 120. Thus, the present embodiment can prevent heat conduction from the limiting plate 174 and the vapor deposition source 171 to the mask 120 via the binding component. Further, the limiting plate 174, providing a cooling effect, can reduce the radiant heat transferred from the vapor deposition source 171 to the mask 120. Thus, the present embodiment can suppress a misalignment due to thermal influence. Further, the presence of the limiting plate 174 between the vapor deposition source 171 and the mask 120 can suppress unnecessary adhesion of the material to the mask 120.

Since the present embodiment enables a vapor deposition step of forming a film on the substrate 10 using the vapor deposition device 1, it can achieve a vapor deposition method applicable to the substrate 10 which is a large one.

Since the present embodiment enables a method for manufacturing an organic EL element including a vapor deposition step of forming a film using the vapor deposition device 1, it can achieve a method for manufacturing an organic EL element applicable to the substrate 10 which is a large one.

Embodiment 2

In the present embodiment, the characteristic features of the present embodiment are mainly described and the same points as in Embodiment 1 are not described. The components having the same or similar functions have the same or similar reference numerals in both the present embodiment and Embodiment 1, and such components are not described in the present embodiment. The present embodiment is substantially the same as Embodiment 1 except for the following points.

Figure 8:
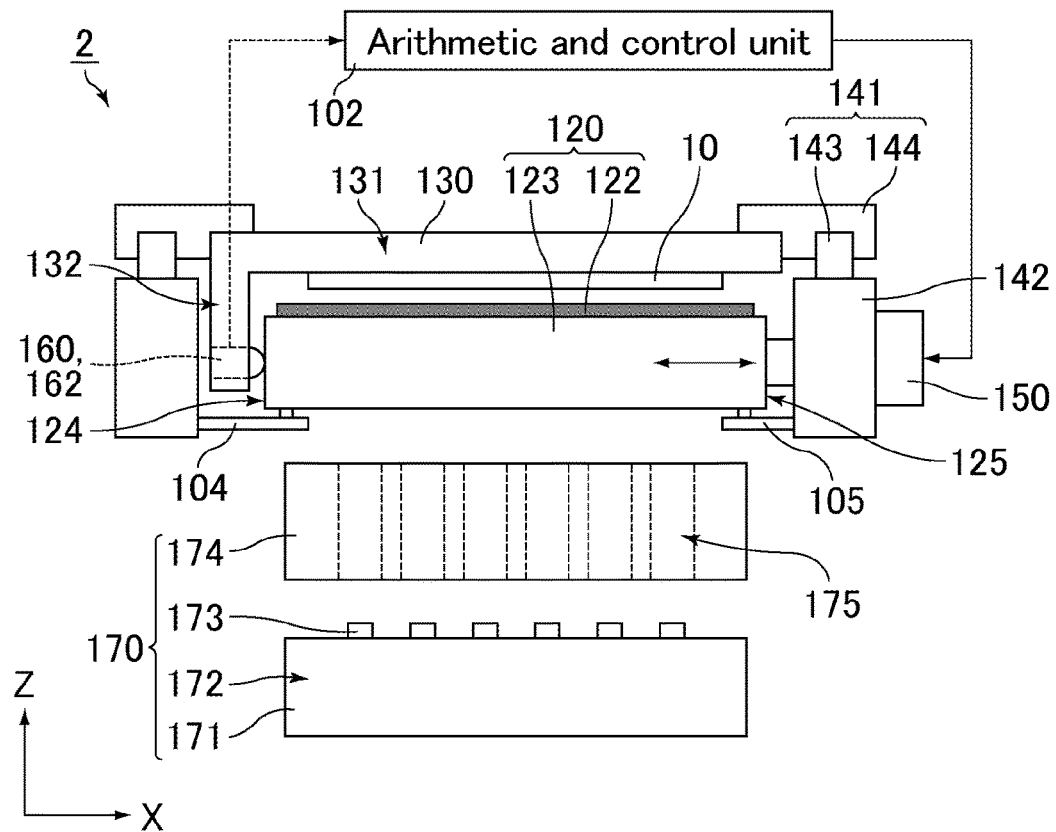
FIG. 8 is a schematic front view of a vapor deposition device according to Embodiment 2.

FIG. 8 is a schematic front view of a vapor deposition device according to Embodiment 2.

As illustrated in FIG. 8, a vapor deposition device 2 according to the present embodiment is provided with multiple contact distance meters 162, instead of the optical distance meters, serving as the distance meters 160 on the guide portion 132 along the transport direction 180. The contact distance meters 162 are disposed in parallel with the transport direction 180 over the entire guide portion 132 in the transport direction 180 at regular intervals.

Figure 9:
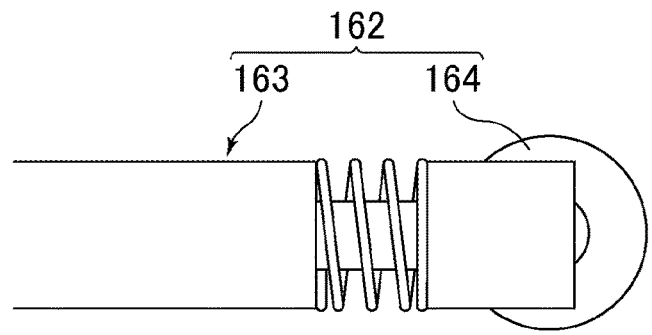
FIG. 9 is a schematic plan view of a contact distance meter of the vapor deposition device according to Embodiment 2.
Figure 10:
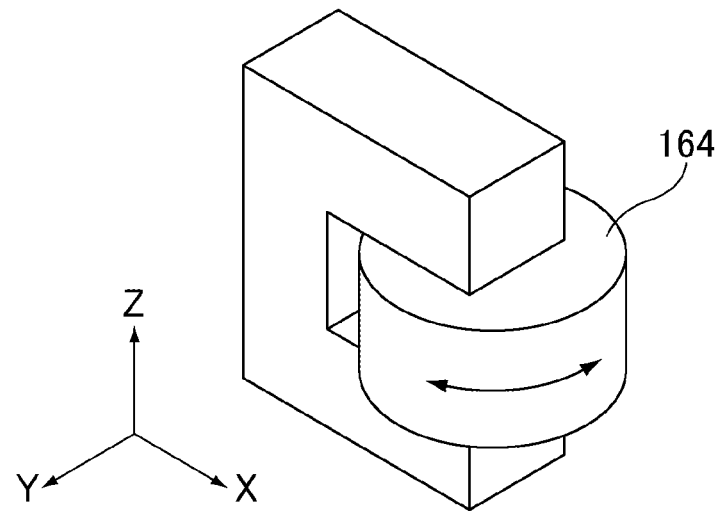
FIG. 10 is a schematic perspective view of a roller of the vapor deposition device according to Embodiment 2.
Figure 11:
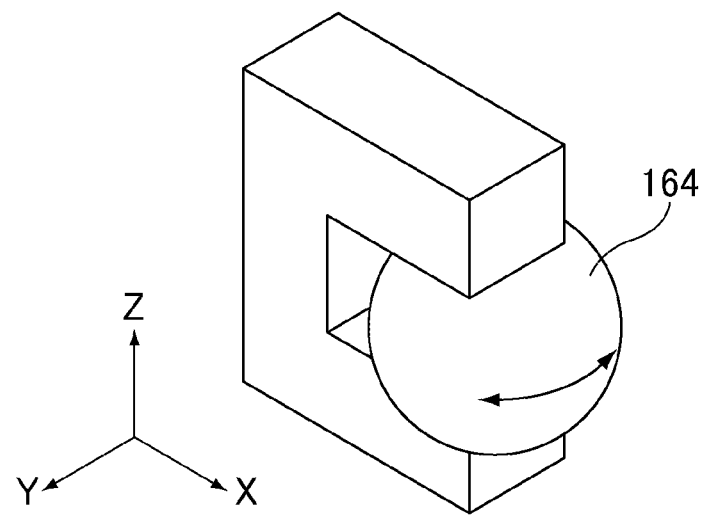
FIG. 11 is a schematic perspective view of another roller of the vapor deposition device according to Embodiment 2.

FIG. 9 is a schematic plan view of a contact distance meter of the vapor deposition device according to Embodiment 2. FIGS. 10 and 11 are each a schematic perspective view of a roller of the vapor deposition device according to Embodiment 2.

As illustrated in FIG. 9, each contact distance meter 162 includes an elastic distance measurement portion 163 and a roller (guide roller) 164 supported by the distance measurement portion 163. As illustrated in FIGS. 10 and 11, each roller 164 is coupled with the distance measurement portion 163 such that it is rotatable in the transport direction 180, and has a cylindrical or spherical shape. Each roller 164 rotates on an axis in the Z-axis direction. The distance measurement portions 163 are the same as each other. Each distance measurement portion 163 is disposed such that it is elastic in the X-axis direction and, by expanding or shrinking, it can measure the distance between the distance meter 162 and the first end 124.

The position of each roller 164 in the X-axis direction is set such that the roller 164 is brought into contact with the first end 124 and the distance measurement portion 163 is shrunk when the guide portion 132 faces the first end 124. Thereby, each contact distance meter 162 can be in contact with the first end 124 and can measure the distance between the distance meter itself and the first end 124 when the guide portion 132 faces the first end 124. As mentioned above, each roller 164 is coupled with the distance measurement portion 163 such that it is rotatable in the transport direction 180 and each distance measurement portion 163 is elastic in the X-axis direction. Thus, the rollers 164 do not inhibit transportation of the substrate tray 130 even when they are in contact with the first end 124.

Figure 12:
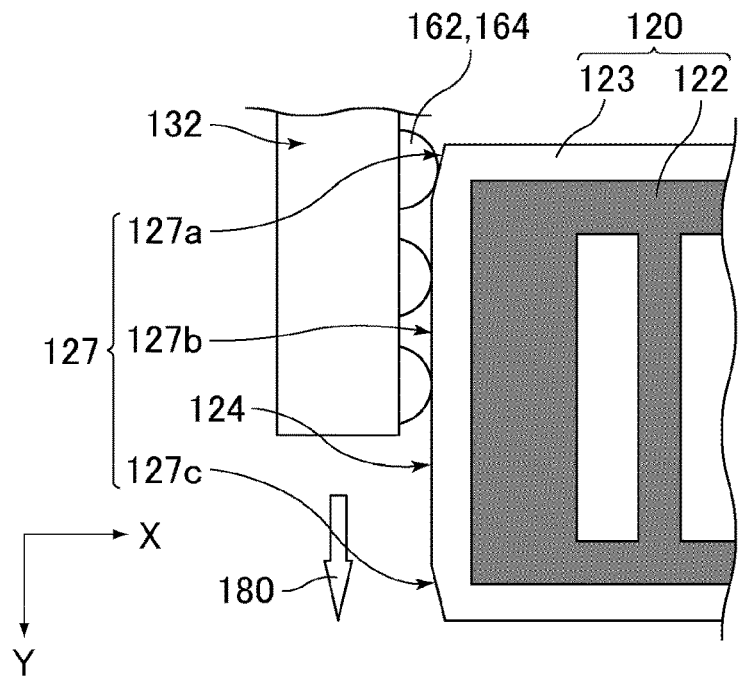
FIG. 12 is a schematic plan view of the vapor deposition device according to Embodiment 2, illustrating a first end of a mask and the vicinity thereof.
Figure 13:
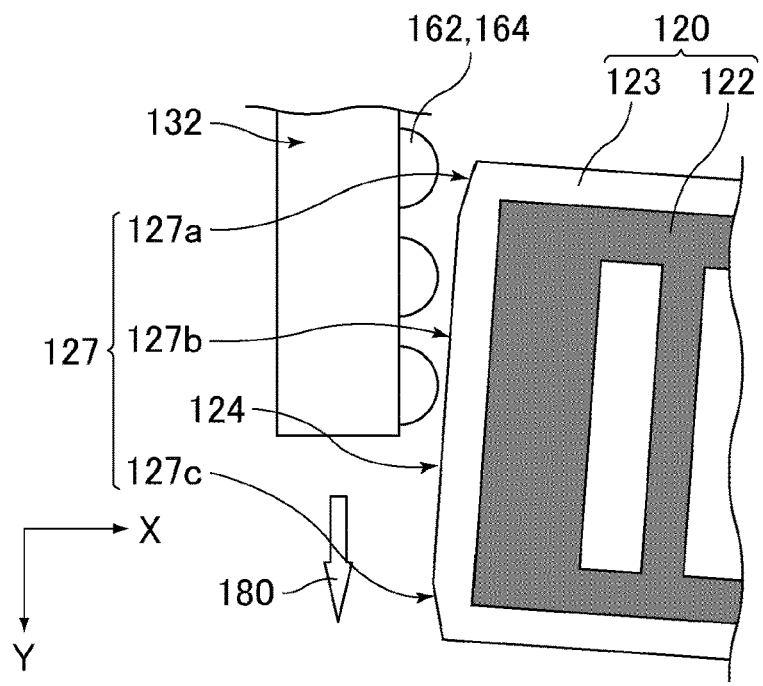
FIG. 13 is a schematic plan view of the vapor deposition device according to Embodiment 2, illustrating the first end of the mask and the vicinity thereof before the contact distance meters contact the mask.
Figure 14:
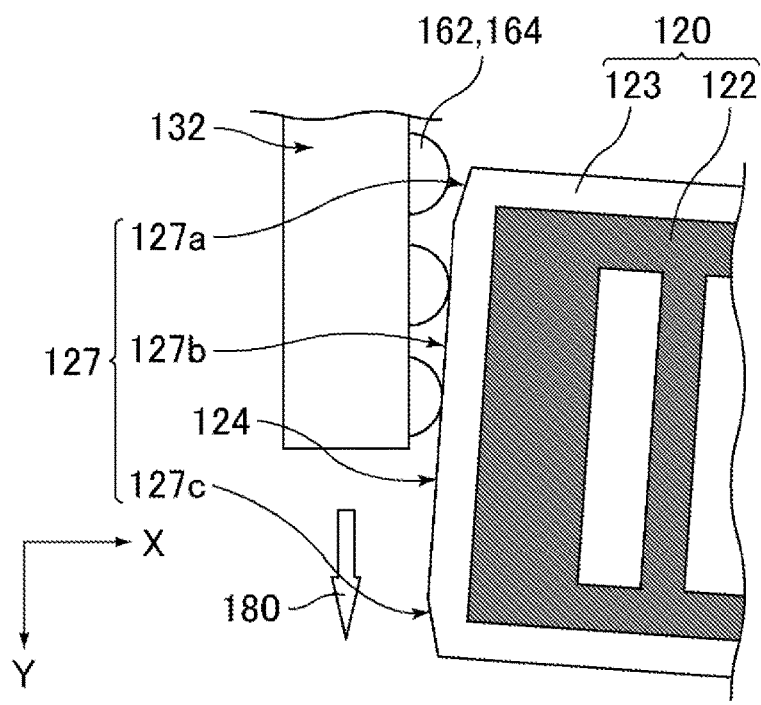
FIG. 14 is a schematic plan view of the vapor deposition device according to Embodiment 2, illustrating the first end of the mask and the vicinity thereof after the contact distance meters contact the mask.
Figure 15:
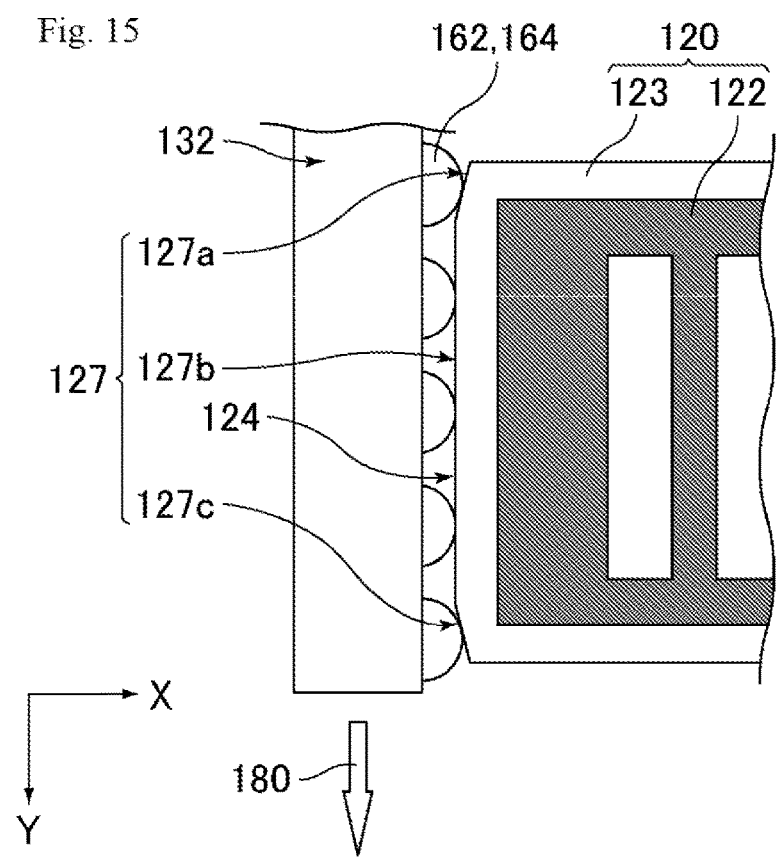
FIG. 15 is a schematic plan view of the vapor deposition device according to Embodiment 2, illustrating the first end of the mask and the vicinity thereof after alignment in the X-axis direction and the θ direction.

FIG. 12 is a schematic plan view of the vapor deposition device according to Embodiment 2, illustrating a first end of a mask and the vicinity thereof. FIG. 13 is a schematic plan view of the vapor deposition device according to Embodiment 2, illustrating the first end of the mask and the vicinity thereof before the contact distance meters contact the mask. FIG. 14 is a schematic plan view of the vapor deposition device according to Embodiment 2, illustrating the first end of the mask and the vicinity thereof after the contact distance meters contact the mask. FIG. 15 is a schematic plan view of the vapor deposition device according to Embodiment 2, illustrating the first end of the mask and the vicinity thereof after alignment in the X-axis direction and the direction.

As illustrated in FIG. 12, the first end 124 of the frame 123 is provided with a roller-contact portion 127 configured to be brought into contact with the rollers 164 when the guide portion 132 faces the first end 124. The roller-contact portion 127 is disposed along the transport direction 180. The roller-contact portion 127 has a flat, smooth surface, preferably having been processed to have a sealing surface. The roller-contact portion 127 includes a flat middle portion in the transport direction 180. Preferably, as illustrated in FIG. 12, the roller-contact portion 127 is partially inclined toward the second end 125 on the upstream and downstream sides of transportation of the substrate 10. In other words, preferably, the roller-contact portion 127 includes an inclined portion 127a on the upstream side of transportation of the substrate 10, a flat middle portion 127b, and an inclined portion 127c on the downstream side of transportation of the substrate 10, and the middle portion 127b is linked with the inclined portions 127a and 127c without steps. In this case, as illustrated in FIGS. 13 to 15, each roller 164 is successively brought into contact with the inclined portion 127a, the middle portion 127b, and the inclined portion 127c as the substrate tray 130 is transported. Based on the measurement data of the respective contact distance meters 162, the mask 120 is aligned in the X-axis direction and the θ direction.

It should be noted that the contact distance meters 162 are programmed by the arithmetic and control unit 102 such that they measure the distance to the middle portion 127b excluding the inclined portions 127a and 127c but do not measure the distances to the inclined portions 127a and 127c.

The number of the contact distance meters 162 may be any number as long as it is 2 or more, and may be appropriately set in consideration with the design matters such as the dimensions of the substrate 10 and the mask 120, and the presence of the inclined portions 127a and 127c. In general, the number thereof is 3 or more, and may be 4 or 5. For example, there may be a situation where two contact distance meters 162 are simultaneously in contact with the respective inclined portions 127a and 127c while one to three contact distance meter(s) 162 is/are in contact with the middle portion 127b simultaneously.

The entire roller-contact portion 127 may be flat without the inclined portions 127a and 127c.

As mentioned above, in the present embodiment, each of the distance meters 160 is the contact distance meter 162 including the elastic distance measurement portion 163 and the roller 164 supported by the distance measurement portion 163 in a rotatable manner, the distance meters 160 are disposed over the entire guide portion 132 along the transport direction 180 such that the distance measurement portions 163 are elastic in the X-axis direction (the second direction) and the rollers 164 are rotatable in the transport direction 180, the first end 124 includes the roller-contact portion 127 configured to be in contact with the rollers 164 when the guide portion 132 faces the first end 124, the roller-contact portion 127 includes the flat middle portion 127b in the transport direction 180, at least two of the rollers 164 are configured to be in contact with the middle portion 127b when the guide portion 132 faces the first end 124, and at least two of the distance measurement portion 163 supporting the at least two rollers 164 in contact with the middle portion 127b are configured to shrink to measure a distance between the distance meter 160 and the first end 124. Thereby, like Embodiment 1, the mask 120 can be aligned in the X-axis direction and the θ direction. Thus, the present embodiment can achieve a vapor deposition device provided with a novel alignment mechanism applicable to the substrate 10 which is a large one.

Preferably, each of the distance meters 160 is the contact distance meter 162 including the elastic distance measurement portion 163 and the roller 164 supported by the distance measurement portion 163 in a rotatable manner, the distance meters 160 are disposed on the guide portion 132, the first end 124 includes the roller-contact portion 127 configured to be in contact with the rollers 164 when the guide portion 132 faces the first end 124, and the roller-contact portion 127 is partially inclined toward the second end 125 on the upstream and downstream sides of transportation of the substrate 10. This can soften shocks when the rollers 164 are brought into contact with the roller-contact portions 127 and when the rollers 164 are released from the roller-contact portions 127, enabling alignment with higher precision.

Embodiment 3

In the present embodiment, the characteristic features of the present embodiment are mainly described and the same points as in Embodiment 1 are not described. The components having the same or similar functions have the same or similar reference numerals in both the present embodiment and Embodiment 1, and such components are not described in the present embodiment. The present embodiment is substantially the same as Embodiment 1 except for the following points.

Figure 16:
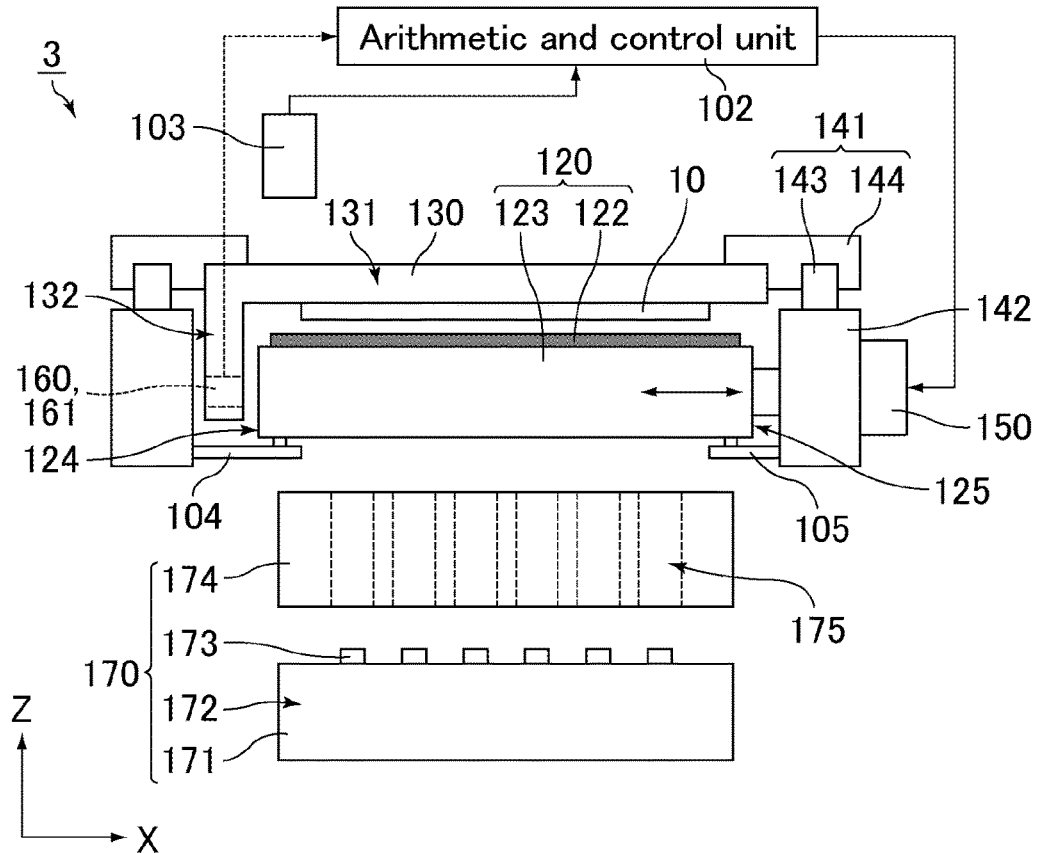
FIG. 16 is a schematic front view of a vapor deposition device according to Embodiment 3.

FIG. 16 is a schematic front view of a vapor deposition device according to Embodiment 3.

As illustrated in FIG. 16, a vapor deposition device 3 according to the present embodiment includes an imager 103 configured to photograph an image of a mask mark and substrate mark to be mentioned later. The imager 103 images the substrate mark and the mask mark at the same time. The arithmetic and control unit 102 measures the distance between the centers of the marks and compares it with the measurement data from the distance meters 160 each time. This enables precise correction of measurement errors of the distance meters 160.

Figure 17:
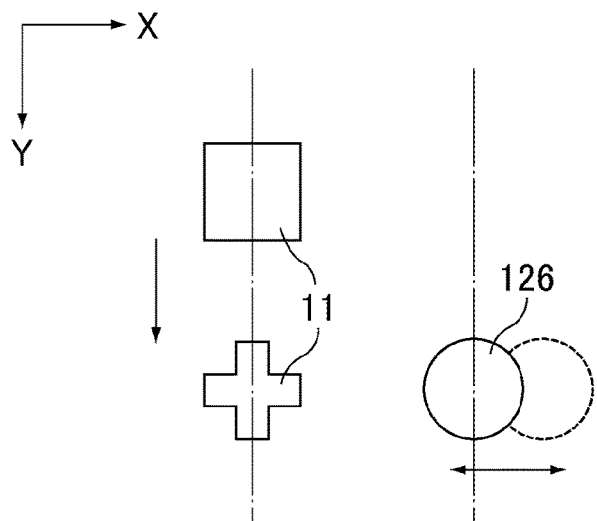
FIG. 17 is a schematic plan view of the vapor deposition device according to Embodiment 3, illustrating alignment marks.

FIG. 17 is a schematic plan view of the vapor deposition device according to Embodiment 3, illustrating alignment marks.

As illustrated in FIG. 17, in the present embodiment, an alignment mark (mask mark) 126, which is the mark for alignment, is formed in the vicinity of the first end 124 of the main surface 122, and multiple alignment marks (substrate marks) 11 are formed along the Y-axis direction in a region of the substrate 10 corresponding to the mask mark 126, i.e., a portion of the substrate 10 on the guide portion 132 side. Further, as illustrated in FIG. 2, the opening 133 is disposed correspondingly to the substrate mark 11 in the vicinity of the guide portion 132 of the substrate-holding portion 131, and the imager 103, such as a CCD camera, is disposed above the opening 133. The imager 103 is disposed outside the chamber and is fixed to the chamber. The imager 103 photographs the alignment marks 11 and 126 at the same time through the opening 133 of the substrate tray 130, and the photograph data is supplied to the arithmetic and control unit 102. As mentioned above, the alignment marks 11 and 126 are formed at positions within the field of vision of the single imager 103.

The alignment marks 11 and 126 and the imager 103 may be disposed at any place, and may be disposed on the second end 125 side. Still, in order to easily detect any defects of the distance meters 160 to be mentioned later and to achieve high-precision alignment, the alignment marks 11 and 126 and the imager 103 are preferably disposed on the first end 124 side, as mentioned above.

Any defects (e.g., measurement errors) of the distance meters 160 cause vapor deposition errors during transportation of the substrate 10. In this case, the function of the distance meters 160 is assisted on the basis of the photograph data of the alignment marks 11 and 126 of the mask 120 and the substrate 10 supplied from the imager 103.

Specifically, first, the photograph data of the imager 103 is supplied to the arithmetic and control unit 102 via a cable. The arithmetic and control unit 102 identifies the images of the alignment marks 11 and 126 themselves based on the input photograph data and calculates the center points of the alignment marks 11 and 126. Next, it calculates the distance between the center points of the alignment marks 11 and 126 (hereinafter, also referred to as the center-to-center distance). Then, the arithmetic and control unit 102 compares the center-to-center distance with a predetermined target distance (target value) and, based on the difference therebetween, calculates a required amount of movement of the mask mark 126 so as to match the center-to-center distance with the target value (e.g., 1 mm), and subsequently calculates a required amount of movement of the mask 120. Based on the required amount of movement of the mask 120, the unit calculates required driving amounts of the drivers 150, and finally supplies the driving amounts to the respective drivers 150 via cables. As a result, each driver 150 drives the mask 120 in the X-axis direction by the input driving amount.

The arithmetic and control unit 102 stores the data on the driving amounts of the drivers 150 and the data on the amount of movement of the mask 120 for each alignment. Then, in order to reduce the difference between these amounts, the arithmetic and control unit 102 is programmed to correct the driving amounts of the drivers 150 based on the above data.

As a result, even if any defects of the distance meters 160 occur, the mask 120 is aligned in the X-axis direction and the θ direction.

The above control may be performed only once during the vapor deposition. Still, the control is preferably performed repeatedly (successively).

In the present embodiment, the vapor deposition unit 170 including the vapor deposition source 171 and the limiting plate 174 is separated from the distance meters 160 and the drivers 150. Thus, a series of the alignment operations can be performed while vapor deposition is performed.

As mentioned above, in the present embodiment, the vapor deposition device 3 further includes the imager 103, the main surface 122 includes the alignment mark (mask mark) 126, and the imager 103 is configured to photograph simultaneously the alignment mark 126 and the alignment mark (substrate mark) 11 on the substrate 10 held by the substrate-holding portion 131. Thus, the imager 103 can photograph the substrate mark 11 and the mask mark 126 at the same time and, even if any defects (e.g., measurement errors) of the distance meters 160 occur, the control by the distance meters 160 can be corrected at high precision based on the photograph data of the imager 103. Therefore, the present embodiment can achieve alignment with higher reliability than Embodiments 1 and 2.

If the substrate 10 is a larger one, the film-forming pattern (panel) has a higher definition, or the number of panels to be produced increases, the alignment precision by the distance meters 160 needs to be more improved. In particular, in the case of performing vapor deposition while transporting the substrate 10 relative to the mask 120, the inclination of the substrate 10 in the θ direction may cause a displacement of the film-forming pattern, which may cause any phenomenon affecting the element functions, such as color mixture. In contrast, the present embodiment enables high-precision correction of a displacement of the substrate 10 in the X-axis direction and an inclination of the substrate 10 in the θ direction which cannot be completely corrected by the distance meters 160 alone. Thus, the present embodiment is more easily applicable to the cases where the substrate 10 is a large one, the film-forming pattern (panel) has a high definition, or the number of panels to be produced increases than Embodiments 1 and 2.

In the present embodiment, the method of assisting the function of the distance meters 160 with the imager 103 was described. Still, an alignment method may be a method in which the imager 103 is mainly used while the distance meters 160 are supplementarily used.

Embodiment 4

In the present embodiment, the characteristic features of the present embodiment are mainly described and the same points as in Embodiment 1 are not described. The components having the same or similar functions have the same or similar reference numerals in both the present embodiment and Embodiment 1, and such components are not described in the present embodiment. The present embodiment is substantially the same as Embodiment 1 except for the following points.

The present embodiment uses an alignment method in which the mask is divided into two parts and the resulting two small masks are used for a single substrate.

Figure 18:
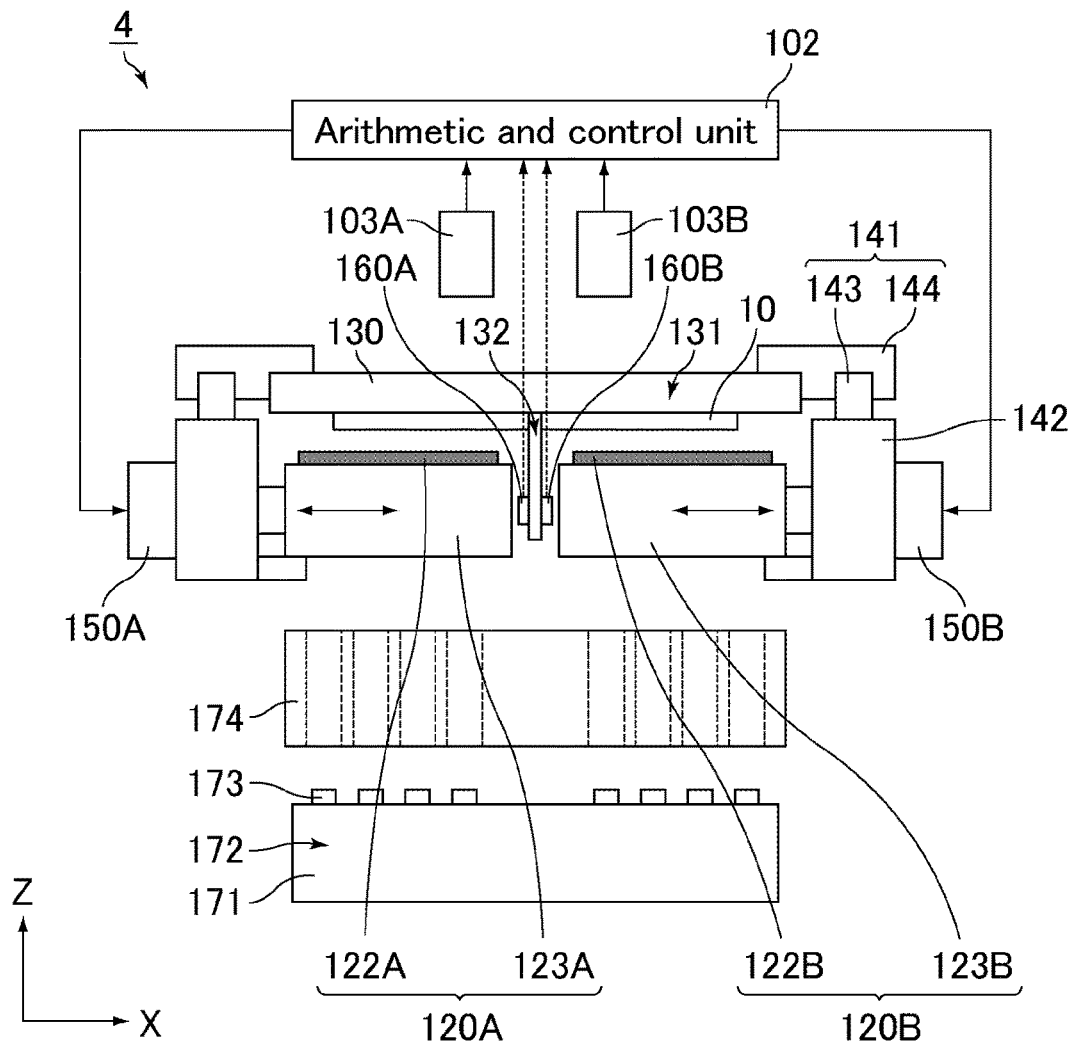
FIG. 18 is a schematic front view of a vapor deposition device according to Embodiment 4.

FIG. 18 is a schematic front view of a vapor deposition device according to Embodiment 4.

As illustrated in FIG. 18, a vapor deposition device 4 according to the present embodiment includes, relative to the single substrate 10, a first mask 120A, a second mask 120B, multiple first distance meters 160A, multiple second distance meters 160B, two first drivers 150A, two second drivers 150B, a first imager 103A, and a second imager 103B. The masks 120A and 120B respectively include main surfaces 122A and 122B and frames 123A and 123B.

The guide portion 132 is disposed across the center portion of the substrate-holding portion 131, and each pair of the above first and second components is disposed symmetrically about the guide portion 132. More specifically, when viewed along the transport direction, the first distance meters 160A, the first mask 120A, and the two first drivers 150A are disposed in this order from the guide portion 132 on the left side of the guide portion 132, and the first imager 103A is disposed at the upper left of the guide portion 132. The second distance meters 160B, the second mask 120B, and the two second drivers 150B are disposed in this order from the guide portion 132 on the right side of the guide portion 132, and the second imager 103B is disposed at the upper right of the guide portion 132. The vapor deposition device 4 is provided with a first alignment system including the first distance meters 160A, the two first drivers 150A, and the first imager 103A, and a second alignment system including the second distance meters 160B, the two second drivers 150B, and the second imager 103B. Thus, like Embodiments 1 to 3, the first and second alignment systems can respectively align the first and second masks 120A and 120B.

As mentioned above, the vapor deposition device 4 according to the present embodiment includes the first mask 120A and the second mask 120B each serving as the mask, the first distance meters 160A and the second distance meters 160B each serving as the distance meter, and the two first drivers 150A and the two second drivers 150B each serving as the driver, the guide portion 132 is disposed across the center portion of the substrate-holding portion 131, and the first mask 120A and the second mask 120B, the first distance meters 160A and the second distance meters 160B, and the two first drivers 150A and the two second drivers 150B are disposed symmetrically about the guide portion 132. Thus, the two masks 120A and 120B can be used for the single substrate 10, and no large mask is required. If a large substrate is used, the mask commonly needs to be a large one. In the scanning vapor deposition mode as described in Embodiments 1 to 3, the mask 120 can be small in the transport direction 180. Still, the mask 120 may disadvantageously be large in the direction perpendicular to the transport direction 180 (the width direction). In contrast, in the present embodiment, the two alignment systems and the two masks 120A and 120B can be disposed for the single substrate 10. Thus, the present embodiment is more easily applicable to the substrate 10 which is a large one than Embodiments 1 to 3.

Also, since the two masks 120A and 120B are disposed for the single substrate 10, multiple panel patterns can be formed within the single substrate 10 using the two masks 120A and 120B. This improves the productivity of panels. Also, the vapor deposition device 4 can be effectively used not only as a device for mass production but also as a device for experiments.

Figure 19:
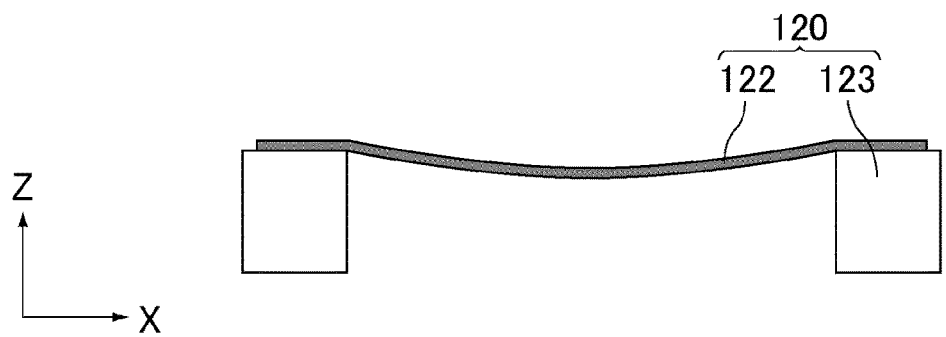
FIG. 19 is a schematic cross-sectional view of the mask of the vapor deposition device according to any one of Embodiments 1 to 3.
Figure 20:
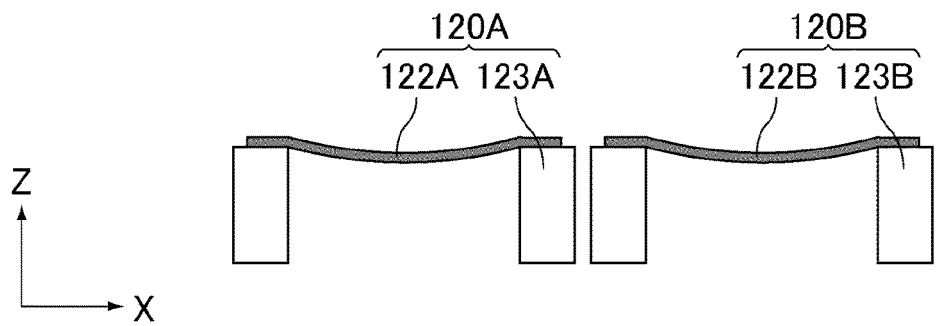
FIG. 20 is a schematic cross-sectional view of masks of the vapor deposition device according to Embodiment 4.
Figure 21:
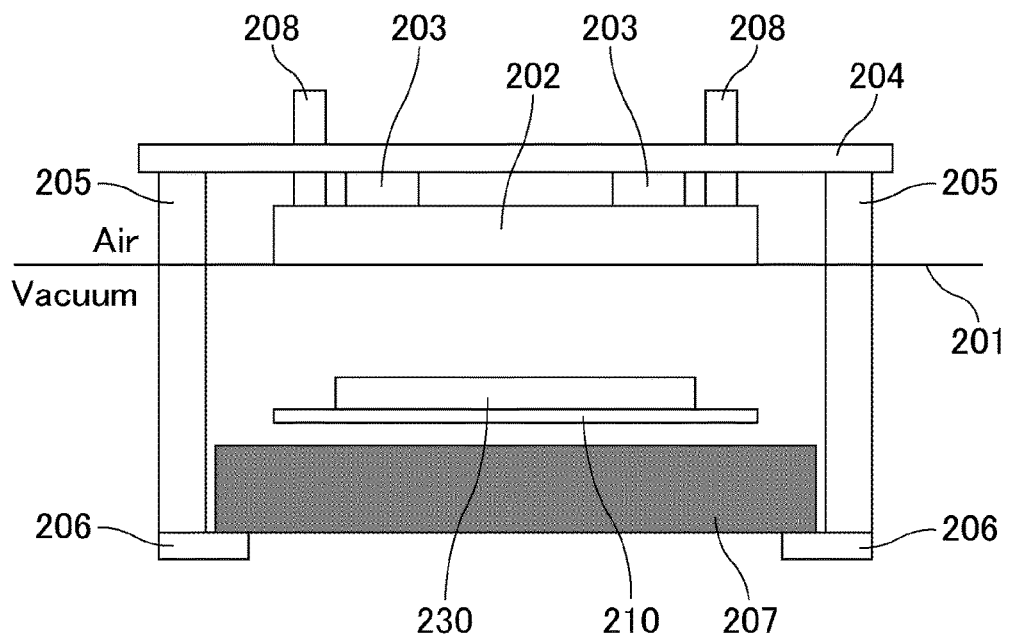
FIG. 21 is a schematic cross-sectional view of a vapor deposition device according to Comparative Embodiment 1 that the inventors have examined.

FIG. 19 is a schematic cross-sectional view of the mask of the vapor deposition device according to any one of Embodiments 1 to 3. FIG. 20 is a schematic cross-sectional view of masks of the vapor deposition device according to Embodiment 4.

Since the two masks 120A and 120B are disposed for the single substrate 10 in the present embodiment, the masks 120A and 120B can be small. Thus, the present embodiment can exert the following effects.

First, the present embodiment can improve the mask precision (production precision), which may be an issue in the case of large masks, and thus can improve the yields of the masks 120A and 120B.

Further, the masks 120A and 120B can be easily replaced. The masks need to be replaced at regular intervals. Large masks are very difficult to handle, but small masks can be easily replaced.

As illustrated in FIGS. 19 and 20, the masks 120A and 120B are each less likely to suffer deflection at the center portion due to the weight thereof than a single mask 120. More specifically, the mask 120A is less likely to suffer deflection due to the weight thereof at the center portion of the main surface 122A supported by the frame 123A, and the mask 120B is less likely to suffer deflection due to the weight thereof at the center portion of the main surface 122B supported by the frame 123B. This can suppress expansion of the displacement and blur of the film-forming pattern due to changes in gaps (G) between the substrate 10 and each of the masks 120A and 120B.

The position of the guide portion 132 in the X-axis direction may be any position within the region corresponding to the substrate 10, and can be appropriately adjusted in accordance with the pattern of the substrate 10. In this case, the two masks 120A and 120B may have different dimensions. Still, the positions of the imagers 103A and the 103B in the X-axis direction can also be appropriately adjusted in accordance with the dimensions of the masks 120A and 120B. In contrast, the vapor deposition device of Comparative Embodiment 1 includes the alignment stage at an upper portion of the device. Thus, the positions of the two or more CCD cameras are fixed and cannot be changed.

In FIG. 18, the vapor deposition source 171 and the limiting plate 174 are shared between the two masks 120A and 120B (one source). Alternatively, they may be divided for the respective masks 120A and 120B so that two vapor deposition sources and two limiting plates may be used (two sources). In this case, these components are easily replaced, improving the maintainability.

The respective embodiments are described for the cases where the vapor deposition device includes multiple distance meters and two drivers for a single mask, the two drivers are coupled with the second end at different places in the transport direction, and each driver can drive the mask in the X-axis direction based on the measured values of the distance meters. Alternatively, in each embodiment, the device may include one distance meter and one driver coupled with the second end for a single mask, and the driver may drive the mask in the X-axis direction based on the measured value of the distance meter. Also in this case, similar to the cases described in the respective embodiments, the mask can be aligned in the X-axis direction using the distance meter and the driver while the substrate is transported. Although the mask cannot be aligned in the θ direction in this case, such an embodiment is also applicable to practical use. This is because, as mentioned above, only the pre-alignment of the substrate and the pre-alignment of the mask enable the orientation of the mask relative to the substrate to fall within the practical tolerance. In this case, the mask holders may hold the masks such that the mask is movable only in the X-axis direction or may hold the first or second end via an X-axis guide movable in the X-axis direction.

The respective embodiments are applicable to not only horizontal transportation but also vertical transportation. In other words, the components of the vapor deposition device in each embodiment may be arranged in any direction. For example, the aforementioned structure may be rotated on the Y axis by 90° so that the vapor deposition source, the limiting plate, the mask, and the substrate may be arranged horizontally.

An organic EL display element manufactured using the vapor deposition device of any one of the embodiments may be used for a monochrome display device. In this case, a light-emitting material of one color may be vapor-deposited and a light-emitting layer of one color alone may be formed in the step of vapor-depositing a light-emitting layer.

The vapor deposition device of any one of the embodiments may be applied to the vapor deposition steps other than the step of vapor-depositing a light-emitting layer, and a film pattern may be formed in the same manner as in the step of vapor-depositing a light-emitting layer. For example, an electron-transport layer of an organic EL element may be formed for each of the sub-pixels of the respective colors.

Further, the embodiments are described referring to examples in which an organic EL element is formed. Still, the use of the vapor deposition device according to the present invention should not be limited to manufacturing of an organic EL element, and the vapor deposition device may be used in formation of various film patterns.

The aforementioned embodiments may be employed in any appropriate combination as long as the combination is not beyond the spirit of the present invention. The modified examples of the respective embodiments may be combined with any other embodiments.

REFERENCE SIGNS LIST

1, 2, 3, 4: vapor deposition device
10: substrate
11: alignment mark (substrate mark)
102: arithmetic and control unit
103, 103A, 103B: imager
104, 105: mask holder
106: guide
120, 120A, 120B: mask
121: opening
122, 122A, 122B: main surface 123, 123A, 123B: frame
124: first end
125: second end
126: alignment mark (mask mark)
127: roller-contact portion
127a: inclined portion
127b: middle portion
127c: inclined portion
130: substrate tray
131: substrate-holding portion
132: guide portion
133: opening
141: transport guide
142: transport stage
143: guide rail
144: slider
150, 150A, 150B: driver
160, 160A, 160B: distance meter
161: optical distance meter
162: contact distance meter
163: distance measurement portion
164: roller
170: vapor deposition unit
171: vapor deposition source (vaporization source)
172: diffusing portion
173: injection port (opening)
174: limiting plate
175: opening
180: transport direction

The invention claimed is:

1. A vapor deposition device for performing vapor deposition while transporting a substrate in a first direction, the vapor deposition device comprising:
a mask including a first end, a second end disposed on the side opposite to the first end, and a main surface provided with multiple openings for patterning;
a substrate tray including a substrate-holding portion configured to hold a substrate and a guide portion protruding from the substrate-holding portion in the direction crossing a plane parallel to the substrate and disposed along the first direction;
a transport guide configured to guide the substrate tray in the first direction such that the substrate-holding portion and the guide portion respectively face the main surface and the first end;
at least one distance meter disposed on the first end or the guide portion; and
at least one driver coupled with the second end,
the at least one distance meter being configured to measure a distance between the at least one distance meter and the guide portion or the first end when the guide portion faces the first end,
the at least one driver being capable of driving the mask in a second direction perpendicular to the first direction based on the measured value of the at least one distance meter.

2. The vapor deposition device according to claim 1, wherein the at least one distance meter comprises an optical distance meter.

3. The vapor deposition device according to claim 1, wherein the at least one distance meter comprises a contact distance meter and is disposed on the guide portion.

4. The vapor deposition device according to claim 3, wherein the contact distance meter includes an elastic distance measurement portion and a roller supported by the distance measurement portion in a rotatable manner.

5. The vapor deposition device according to claim 1, wherein the at least one distance meter comprises multiple distance meters and the at least one driver comprises two drivers, and
the two drivers are coupled with the second end at different places in the first direction.

6. The vapor deposition device according to claim 5, wherein each of the distance meters is a contact distance meter including an elastic distance measurement portion and a roller supported by the distance measurement portion in a rotatable manner,
the distance meters are disposed over the entire guide portion along the first direction such that the distance measurement portions are elastic in the second direction and the rollers are rotatable in the first direction,
the first end includes a roller-contact portion configured to be in contact with the rollers when the guide portion faces the first end,
the roller-contact portion includes a flat middle portion in the first direction,
at least two of the rollers are configured to be in contact with the middle portion when the guide portion faces the first end, and
at least two of the distance measurement portions supporting the at least two rollers in contact with the middle portion are each configured to shrink to measure a distance between the distance meter and the first end.

7. The vapor deposition device according to claim 5, wherein each of the distance meters is a contact distance meter including an elastic distance measurement portion and a roller supported by the distance measurement portion in a rotatable manner,
the distance meters are disposed on the guide portion,
the first end includes a roller-contact portion configured to be in contact with the rollers when the guide portion faces the first end, and
the roller-contact portion is partially inclined toward the second end on the upstream and downstream sides of transportation of the substrate.

8. The vapor deposition device according to claim 1, wherein the at least one driver is removably coupled with the second end.

9. The vapor deposition device according to claim 1, further comprising:
a vapor deposition source; and
a limiting plate disposed between the vapor deposition source and the mask,
wherein the vapor deposition device is free from a binding component integrating the mask with the limiting plate and the vapor deposition source between the limiting plate and the mask.

10. The vapor deposition device according to claim 1, further comprising an imager,
wherein the main surface includes an alignment mark, and
the imager is configured to photograph simultaneously the alignment mark and an alignment mark on the substrate held by the substrate-holding portion.

11. The vapor deposition device according to claim 1, wherein the vapor deposition device includes first and second masks each serving as the mask, first and second distance meters each serving as the distance meter, and first and second drivers each serving as the driver, the guide portion is disposed across a center portion of the substrate-holding portion, and the first and second masks, the first and second distance meters, and the first and second drivers are disposed symmetrically about the guide portion.

12. A vapor deposition method comprising a vapor deposition step of forming a film on a substrate, the vapor deposition step being performed using the vapor deposition device according to claim 1.

13. A method for manufacturing an organic electroluminescence element, comprising a vapor deposition step of forming a film using the vapor deposition device according to claim 1.

* * * * *